United States Patent [19]
Dilbeck

[11] Patent Number: 6,108,394
[45] Date of Patent: Aug. 22, 2000

[54] SINGLE CELL PER BIT SHIFT REGISTER

[75] Inventor: Stephen D. Dilbeck, Santa Cruz, Calif.

[73] Assignee: C-Cube Semiconductor II, Inc., Milpitas, Calif.

[21] Appl. No.: 09/205,555

[22] Filed: Dec. 4, 1998

[51] Int. Cl.$^7$ .................................................. G11C 19/00
[52] U.S. Cl. .............................. 377/67; 377/78; 377/79
[58] Field of Search ............................... 577/78, 79, 67

[56] References Cited

U.S. PATENT DOCUMENTS

| 5,619,157 | 4/1997 | Kumata et al. | 377/78 |
| 5,633,905 | 5/1997 | Brown | 377/78 |

Primary Examiner—Margaret R. Wambach
Attorney, Agent, or Firm—Fish & Richardson P.C.

[57] ABSTRACT

A shift register matrix including a matrix of cells having a plurality of rows and a plurality of columns, each cell storing one bit of data. A plurality of pulse generators is included to generate pulses to the cells which cause new data to be shifted into the cells. One pulse generator is included for each column of the matrix. The pulse generator for each column is coupled to all the cells in the column. Each pulse generator supplies a pulse to each of the cells in its respective column to cause new data to be shifted into the cells of that column. The pulses are sent to the respective columns in sequential order, one column at a time, until all the data in the matrix has been shifted by one bit.

4 Claims, 7 Drawing Sheets

(Prior Art)

SINGLE CELL PER BIT SHIFT REGISTER

FIELD OF THE INVENTION

The present invention relates generally to electronic circuits and more particularly to a minimal cell size shift register.

BACKGROUND OF THE INVENTION

Figure 1A:
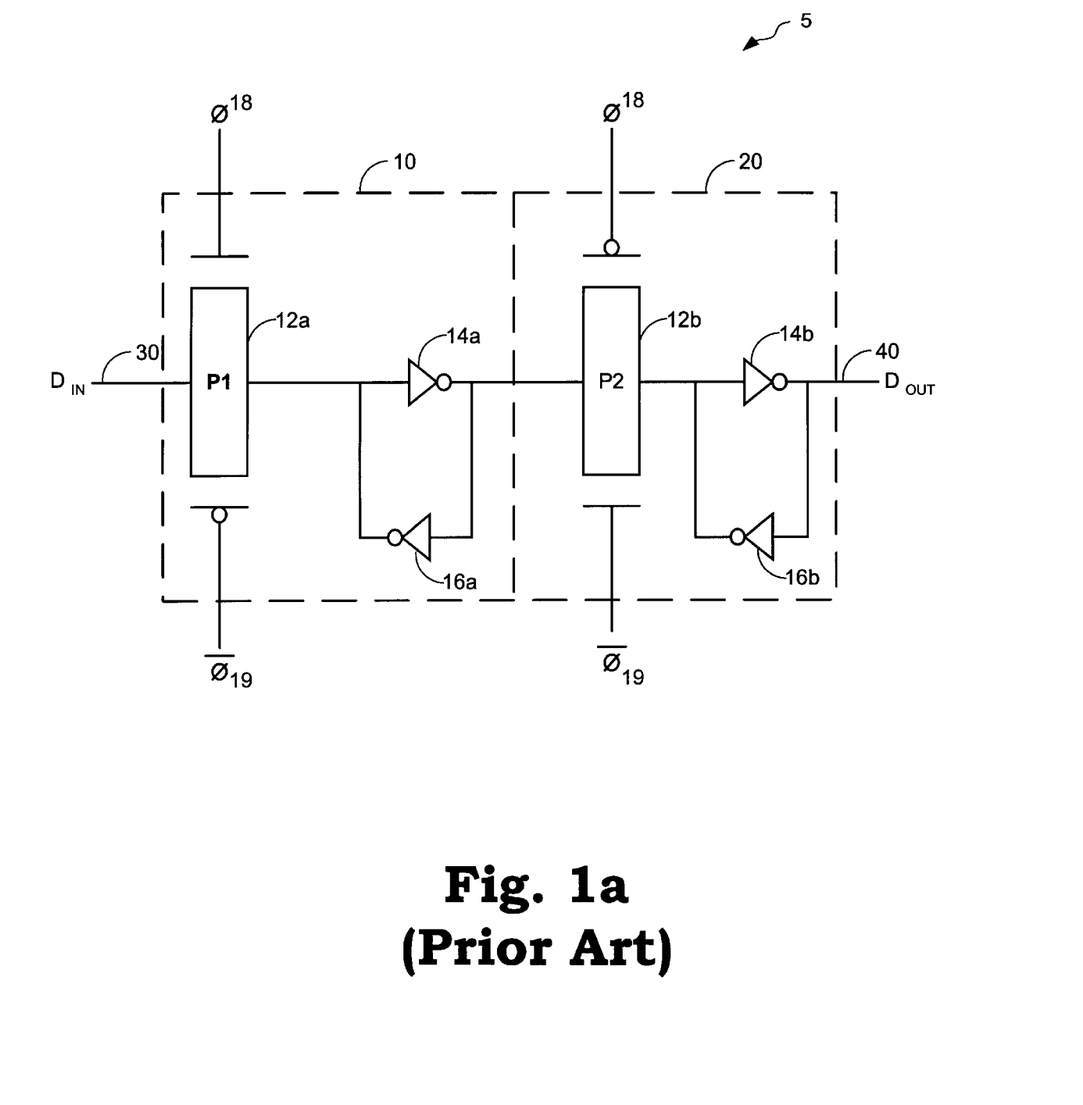
FIG. 1a is a circuit diagram of a prior art shift register holding cell.
Figure 1B:
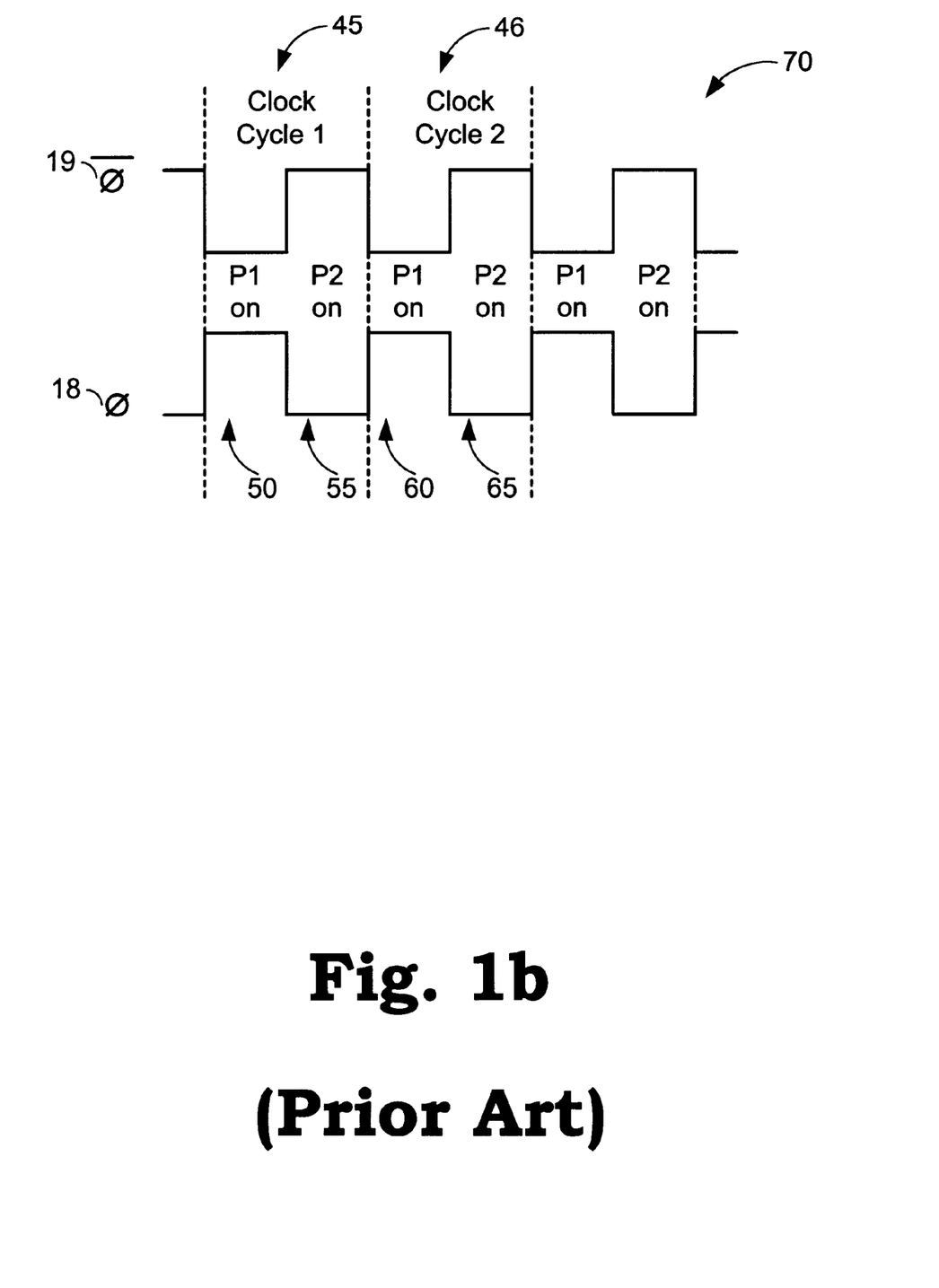

A shift register is an electronic circuit used in numerous applications where shifting of data is required. Conventional shift registers use a master slave configuration of cells to act as a holding cell for a single bit of data. Referring now to FIG. 1a, a conventional shift register holding cell 5 includes an input cell 10 having a data input port 30 coupled to an output cell 20 having a data output port 40. Each of the input cell 10 and output cell 20 include a pass gate 12, main inverter 14 and feedback inverter 16. Input cell 10 and output cell 20 are clocked by two clocks, clock 18 and inverted clock 19. A timing diagram 70 associated with the operation of shift register holding cell 5 is shown in FIG. 1b. Timing diagram 70 includes first clock cycle 45 and second clock cycle 46. First clock cycle 45 is divided into a first half clock cycle 50 and a second half clock cycle 55. Second clock cycle 46 is divided into a first half clock cycle 60 and second half clock cycle 65. The operation of shift register holding cell 5 will be discussed in coordination with the timing diagram shown in FIG. 1b. During first half clock cycle 50, pass gate 12a is turned on. Pass gate 12a is turned on by the high and low signal levels produced by clock 18 and inverted clock 19, respectively, during first half clock cycle 50. When pass gate 12a is turned on, data arriving at data input port 30 is passed to the input of main inverter 14a. Main inverter 14a inverts the data and provides an output which is coupled to the input of feedback inverter 16a. The output of feedback inverter 16a is then in turn coupled to the input of main inverter 14a. Pass gate 12a is held open long enough for the output of feedback invertor 16a to be driven to an appropriate level so as to maintain the input data value in input cell 10.

During second half clock cycle 55, clock 18 is driven low and inverted clock 19 is driven high causing pass gate 12a to be disabled and pass gate 12b in output cell 20 to be enabled. The enabling of pass gate 12b provides an inverted value of the data input received during the first half clock cycle 50 on data input port 30 to be coupled to main inverter 14b of output cell 20. Main inverter 14b inverts the signal received from the output of main inverter 14a and provides an inverted signal out on data output port 40 which reflects the value received on the data input port 30 at the start of first half clock cycle 50. The output of main inverter 14b is also coupled to the input of feedback inverter 16b whose output is in turn coupled to the input of main inverter 14b. Pass gate 12b is maintained in the enable state long enough for feedback to develop through the feedback inverter 16b so that the data received from input cell 10 may be latched and stored in the invertors of the output cell 20. At the beginning of first half clock cycle 60, pass gate 12b is disabled and pass gate 12a is enabled allowing for a new data input to be transferred into input cell 10 from data input port 30. The new data input provided at data input port 30 is passed in a similar fashion through the input cell and output cell to data output port 40 as described above.

The back-to-back invertors of the input and output cells store data like a memory cell. When pass gate 12a is off then invertors 14a and 16a are used to store data associated with the input received on data input port 30. Similarly, when pass gate 12b is off, invertors 14b and 16b are used to store data received at the input to pass gate 12b. At the completion of one clock cycle, a one bit shift of data is complete. The input cell maintains the old data which is passed to the output cell where it is maintained until the beginning of a new clock cycle.

Conventional shift registers include a plurality of holding cells, one for each bit to be stored (latched). Each holding cell in a shift register typically includes two cells as described above, requiring two transfer gates and four invertors for each bit to be stored in the shift register.

SUMMARY OF THE INVENTION

In general, in one aspect, the invention provides a shift register matrix including a matrix of cells having a plurality of rows and a plurality of columns, each cell storing one bit of data. A plurality of pulse generators is included to generate pulses to the cells which cause new data to be shifted into the cells. One pulse generator is included for each column of the matrix. The pulse generator for each column is coupled to all the cells in the column. Each pulse generator supplies a pulse to each of the cells in its respective column to cause new data to be shifted into the cells of that column. The pulses are sent to the respective columns in sequential order, one column at a time, until all the data in the matrix has been shifted by one bit.

In another aspect, the invention provides a shift register matrix including a first source of clock pulses having a first predetermined duration, a second source of clock pulses having a second duration which is substantially an integral multiple n of the first predetermined duration and a plurality of matrices of cells. One matrix is adjacent to the next. Each matrix has a plurality of rows and n columns of cells, n−1 of which are data columns and one of which is a spare column. Each of the pulse generators being coupled to the cells of a plurality of columns, one column from each matrix. The pulses from the pulse generators causing data to simultaneously be shifted from the respective cells in one column in each matrix to the respective cells of the next adjacent column. The data from the first column of the n−1 data columns of each matrix is received from the spare column of the matrix adjacent to that first column and the data from the last column of the n−1 data columns of each matrix is passed to the spare column of the same matrix.

In another aspect, the invention provides a shift register matrix including a plurality of matrices of cells, one matrix adjacent to the next. Each matrix has at least one row and n columns of cells, n−1 of which are data columns and one of which is a spare column. Each cell includes an input configured to receive a pulse from a pulse generator for triggering a shift of data out of a respective cell. Each cell in a column of cells operable to simultaneously shift data from a respective cell in one column in each matrix to a cell of a next adjacent column. Data input to a first column of the n−1 data columns of each matrix is received from the spare column of a matrix adjacent to that first column and data from a last column of the n−1 data columns of each matrix is passed to the spare column of the same matrix.

Aspects of the invention include numerous features. The shift register matrix can receive as an input data which is coupled to a first column of the n−1 data columns of a first matrix. Data from a last column of the n−1 data columns of a last matrix in the shift register matrix can be provided as an output from the shift register matrix.

The invention provides numerous advantages. A shift register which can be implemented with a single cell per bit.

No master/slave configuration is required. The present invention provides for a performance configurable shift register which may include additional holding cells to allow for the parallel shifting of bits within the shift register in order to satisfy system throughput requirements for shifting data in the shift register. Other features will be apparent from the following description and claims.

BRIEF DESCRIPTION OF THE DRAWING

FIG. 1b is a timing diagram associated with the circuit of FIG. 1a.

DETAILED DESCRIPTION

Figure 2:
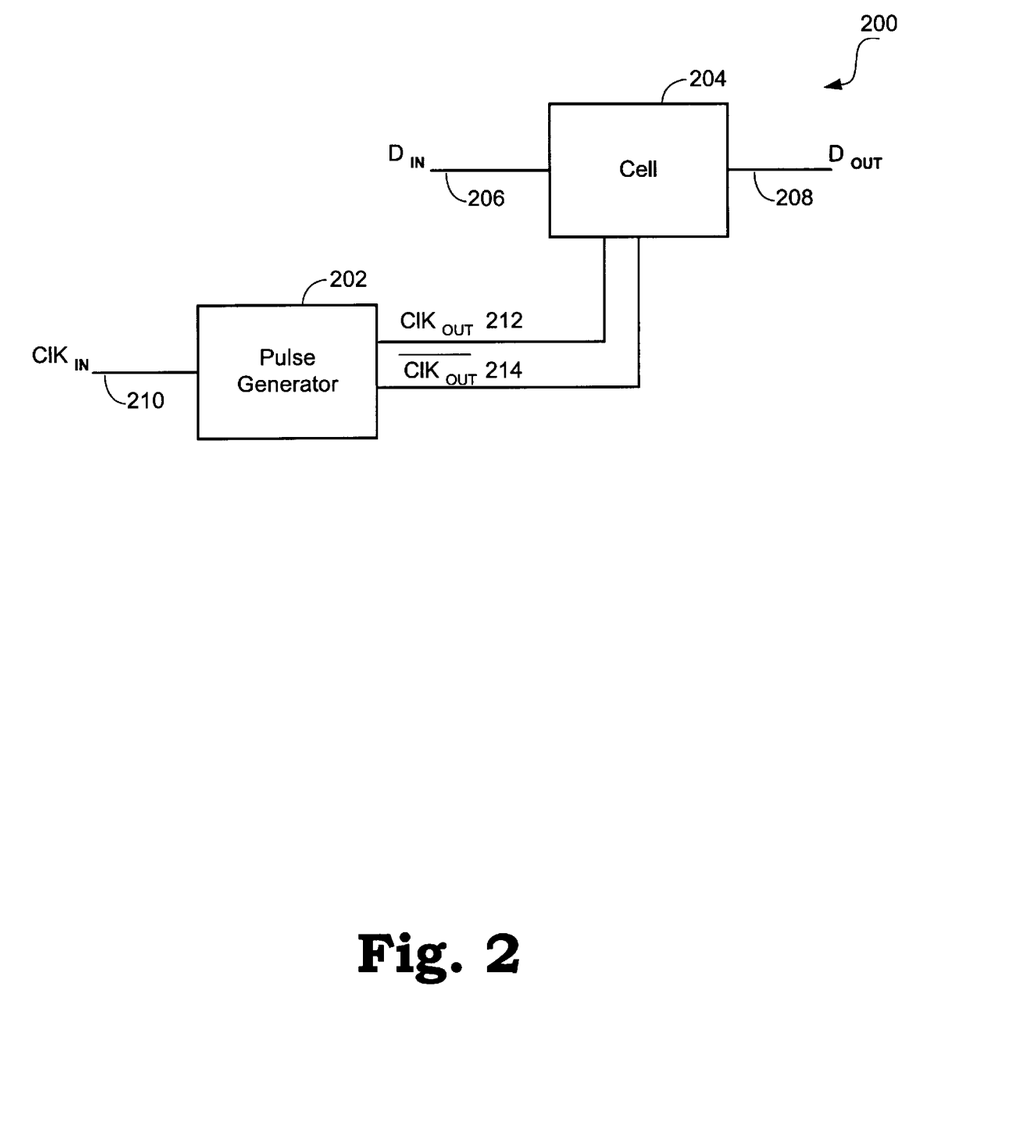
FIG. 2 is a shift register cell according to the present invention.

Referring now to FIG. 2, a shift register cell generally indicated at 200 includes a pulse generator 202 and a cell 204. Cell 204 includes a data input port 206 and a data output port 208. Pulse generator 202 includes a clock input 210. Pulse generator 202 generates two output clock signals, clock output signal 212 and inverted clock output signal 214. Clock output signal 212 and inverted clock output signal 214 are coupled to cell 204.

Figure 3:
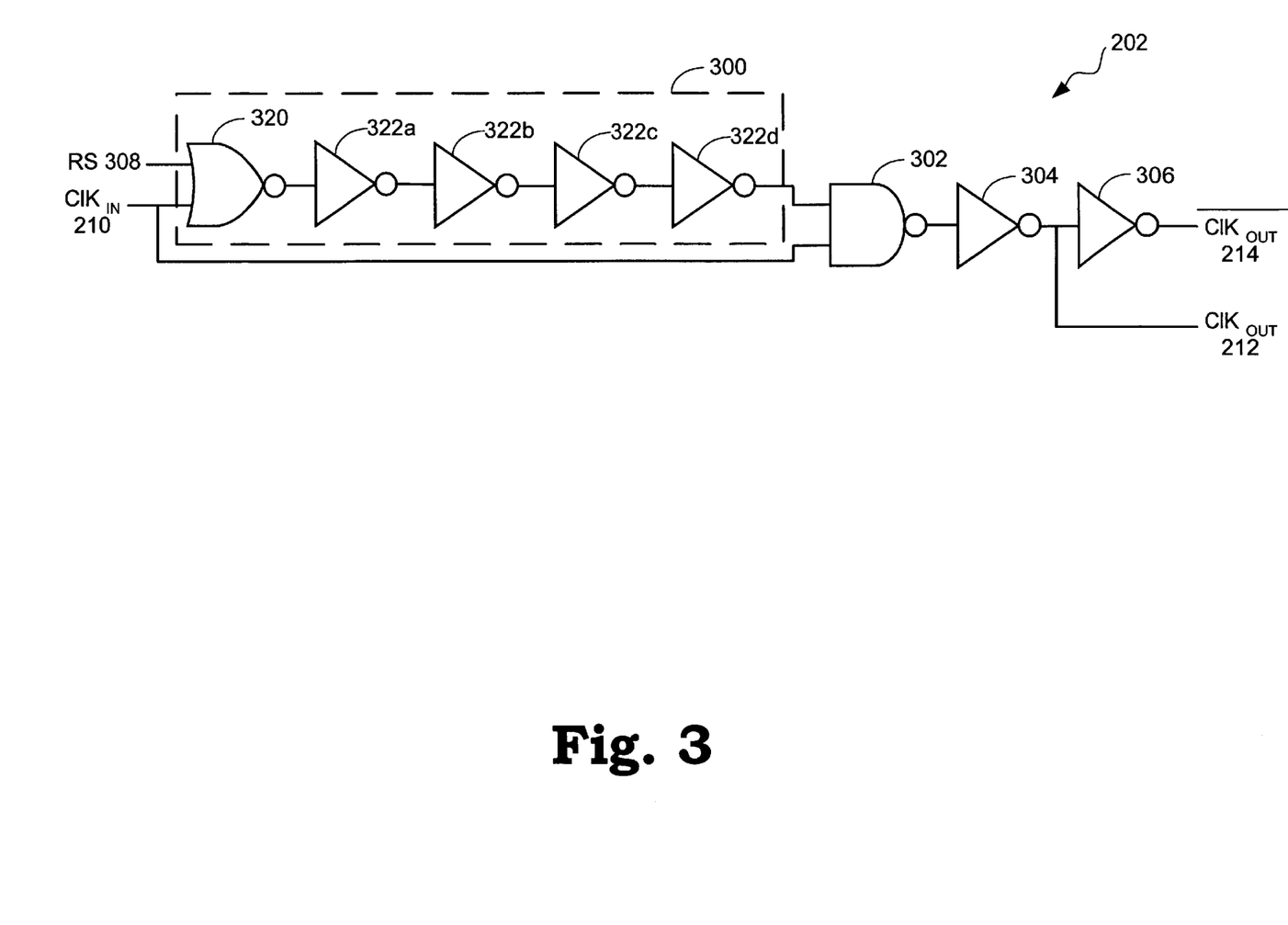
FIG. 3 is a pulse generator according to the present invention.

Referring now to FIG. 3, pulse generator 202 includes a delay chain 300, NAND gate 302, and invertors 304 and 306. Clock input signal 210 is coupled to the input of delay chain 300 and to one input of NAND gate 302. The output of delay chain 300 is coupled to a second input of NAND gate 302. The output of NAND gate 302 is coupled to the input of inverter 304, whose output forms clock output signal 212. The output of inverter 304 is also coupled to the input of inverter 306 whose output forms inverted clock output signal 214.

Delay chain 300 includes NOR gate 320 and invertors 322a, b, c and d. Delay chain 300 is configured to provide an appropriate amount of delay in order to pass data from input port 206 of cell 204 into the holding or latch portion of cell 204 as will be described in greater detail below. Those of ordinary skill in the art will recognize that pulse generator 202 may be any of a generic kind of pulse generator as is known in the art. The pulse generator described is included as an example and should in no way be construed as limiting. Pulse generator 202 provides complimentary clock signals to each cell of the shift register.

Figure 4:
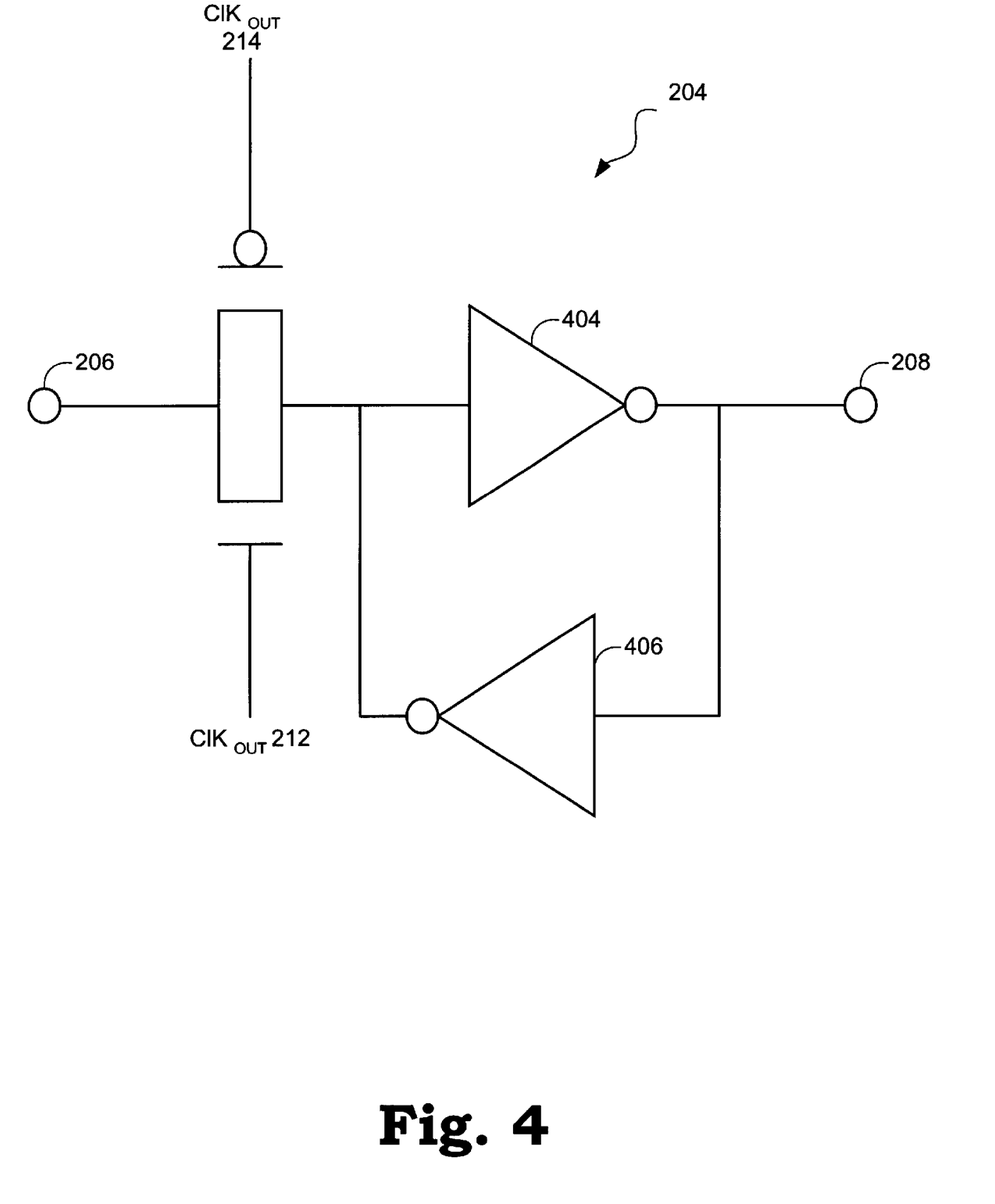
FIG. 4 is a cell according to the present invention.

Referring now to FIG. 4, cell 204 includes a pass gate 402, main inverter 404 and feedback inverter 406. Data input port 206 is coupled to one input of pass gate 402 whose output is coupled to the input of main inverter 404. The output of main inverter 404 is coupled to the input of feedback inverter 406 and also is coupled to data output port 208. The output of feedback inverter 406 is in turn coupled back to the input of main inverter 404. When pass gate 402 is enabled, data is passed from data input port 206 into the input of main inverter 404. The output of inverter 404 is driven to invert the data received on the input port. Pass gate 402 is enabled long enough so that a feedback output from feedback inverter 406 is developed at the input to main inverter 404. After the feedback signal is developed at the input of main invertor 404, the pass gate may be disabled. Those of ordinary skill will recognize that value of the data received at data input port 206 to cell 204 is inverted when transferred out data output port 208. Accordingly, applications using the cell structure described herein may require a data inversion depending on the number of cells cascaded in the particular application.

Figure 5:
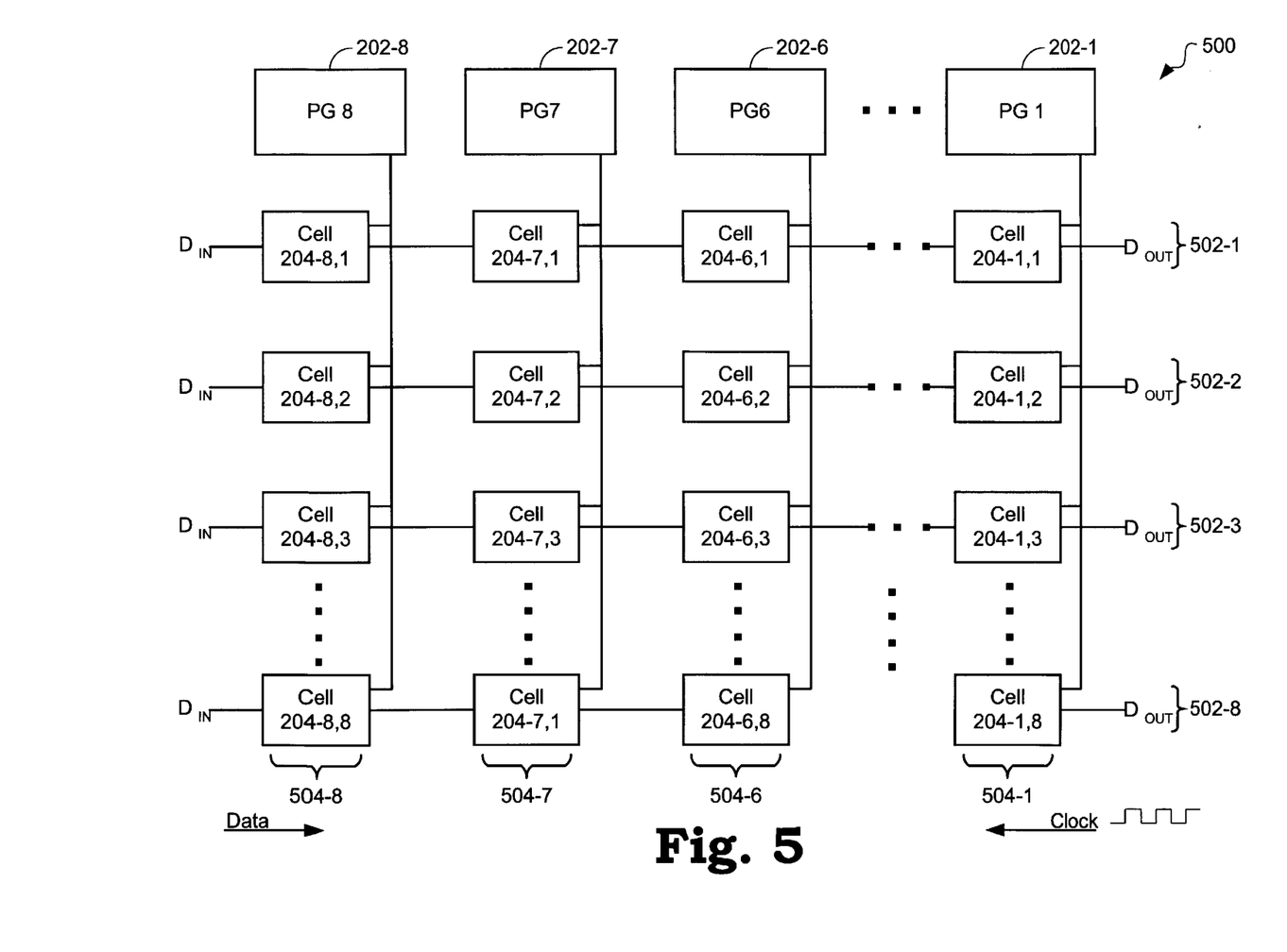
FIG. 5 is a shift register array according to the present invention.

A shift register 500 may be constructed by cascading cells 204 in rows 502 and columns 504 as is shown in FIG. 5. The array may be configured with a number of rows 502 equal to the number of bits that are to be transferred into (and out of) the shift register on a given clock cycle. The number of columns 504 may be selected based on a delay required in the shifting process (the number of clock cycles of delay required to shift a bit through the register) or vice versa. Each cell 204 in a column 504 of shift register array 500 is coupled to a pulse generator 202. For example, pulse generator 202-1 is connected to all cells 204-1 in column 504-1. Accordingly, each cell in a column transfers out data at the same time as every other cell in the column. Likewise each cell in the column receives data in at the same time as every other cell in a given column.

In the implementation shown in FIG. 5, the pulse generators are synchronized resulting in a migration of data across the cells from left to right on the page. Data is first shifted out of the array from the cells in column 504-1. Thereafter, data is shifted from the cells in column 504-2 into the now available cells in column 504-1. This process continues until a new column of input data bits are shifted into the first column 504-8, completing one full shift cycle. The time delay for data to migrate through a typical array is determined based on the number of columns present.

In one implementation, the trailing edge of a clock signal generated by a leading pulse generator may be used as a trigger for a pulse generator in an adjacent column to initiate the transfer of data from one column to the next. For example, the trailing edge of the signal generated by pulse generator 202-7 may be used as a trigger for pulse generator 202-8, and so forth.

In one implementation, a shift register array may be customized to satisfy system performance requirements. For example, a shift register may require 22 bits (holding cells) between the input and the output of the shift register but system performance requirements may not allow a 22 clock cycle delay for the completion of each full shift cycle. The amount of time required to shift the data across the array may be improved by using extra holding cells, or more specifically columns of holding cells.

Figure 6:
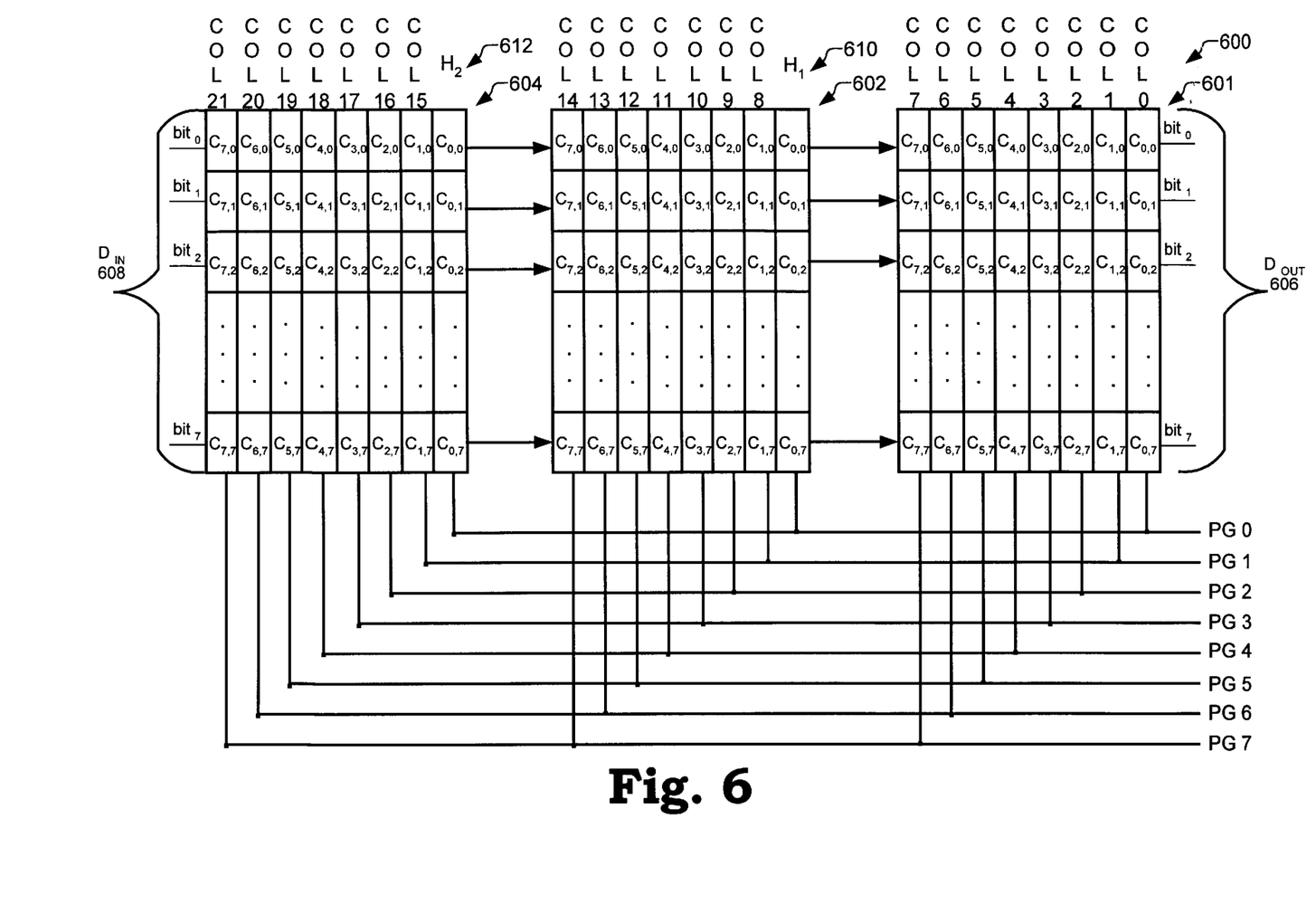
FIG. 6 is a shift register array including holding cells according to the present invention.

In one implementation, a shift register is implemented using multiple arrays where one or more of the arrays includes additional holding cells so that shifts may occur in parallel across portions of the shift register. FIG. 6 shows an implementation having a shift register 600 that includes 3 parallel arrays 601, 602 and 604 of eight columns each. Array 601 includes columns 0 through 7. Array 602 includes columns 8–14 as well as a first holding column 610. Array 604 includes columns 15–21 and a second holding column 612. Array 604 includes a data input port 608 for shifting data into shift register 600. Array 601 includes a data output port 606 for shifting data out of shift register 600. As was described above, each column in shift register 600 is associated with a pulse generator. In this implementation, eight pulse generators PG0–PG7 are included. Pulse generator PG0 is coupled to the last column (column 0) of array 601 as well as to the last columns of arrays 602 and 604 (first holding column 610 and second holding column 612). In a similar fashion, pulse generators PG1–PG7 are coupled to columns in arrays 601, 602 and 604.

Each column includes a plurality of cells $C_{M,N}$, similar in structure to cell 204 (FIG. 4), where M is equal to the number of columns in an array and N is equal to the number of bits transferred in parallel (rows in the array). Each cell stores (latches) one bit of data. In the implementation shown in FIG. 6 each column includes 8 cells (rows) and each array includes 8 columns resulting in a 22×8 bit shift register. Those ordinarily skilled will recognize that other configurations of rows and columns may be selected as a design choice, and accordingly the implementation described should not be construed as limiting.

In operation, data may be shifted in parallel in each of the arrays so that the overall delay in shifting data across the entire shift register is minimized. At a first clock cycle, data may be shifted from column 0 out of the shift register. At the same time, data may be shifted from columns 8 and column 15 into the holding columns 610 and 612 of arrays 602 and 604, respectively. At the second clock cycle, pulse generator PG1 may be enabled to pass data from column 1 into the now vacant column 0 of array 601. At the same time, data may be passed from column 9 into now vacant column 8 in array 602 as well as from column 16 into now vacant column 15 of array 604. The transfer of data in parallel progresses through the array over a period of 7 clock cycles until column 7, column 14 and column 21 are vacant. When these columns are vacant, then new data may be transferred into the array at the data input port and data from each of the respective holding columns 610 and 612 may be transferred to the adjacent array in shift register 600. That is, data from holding column 610 may be transferred into column 7 of array 601. Data from holding column 612 may be transferred into column 14 of array 602. At the same time, data input may be received at column 21 of array 604.

Those of ordinary skill in the art will recognize that separate pulse generators may be provided for each column in the shift register array. The timing associated with the transfers of columns must be configured to provide for the simultaneous parallel transfers within the various different arrays according to the methodologies described above. The time required to transfer all bits in the shift register array is 1/N of the normal time plus one clock cycle, where N equals the number of individual arrays in the shift register. The extra clock cycle is added due to the holding columns. For example, in the shift register shown in FIG. 6, the delay is 8 clock cycles.

The present invention has been described in terms of specific embodiments, which are illustrative of the invention and not to be construed as limiting. Other embodiments are within the scope of the following claims.

What is claimed is:

1. A shift register matrix comprising:

a matrix of cells having a plurality of rows and a plurality of columns, each cell storing one bit of data; and a plurality of pulse generators to generate pulses to the cells which cause new data to be shifted into the cells, one pulse generator for each column of the matrix, the pulse generator for each column being coupled to all the cells in the column;

where each pulse generator supplies a pulse to each of the cells in its respective column to cause new data to be shifted into the cells of that column, the pulses being sent to the respective columns in sequential order, one column at a time, until all the data in the matrix has been shifted by one bit.

2. A shift register matrix comprising:

a first source of clock pulses having a first predetermined duration;

a second source of clock pulses having a second duration which is substantially an integral multiple n of the first predetermined duration; and a plurality of matrices of cells, one matrix adjacent to the next, each matrix having a plurality of rows and n columns of cells, n−1 of which are data columns and one of which is a spare column;

where each of the sources of clock pulses are coupled to the cells of a plurality of columns, one column from each matrix, the pulses from the sources of clock pulses causing data to simultaneously be shifted from the respective cells in one column in each matrix to the respective cells of a next adjacent column, whereby data from a first column of the n−1 data columns of each matrix is received from the spare column of the matrix adjacent to that first column, and data from a last column of the n−1 data columns of each matrix is passed to the spare column of the same matrix.

3. A shift register matrix comprising:

a plurality of matrices of cells, one matrix adjacent to the next, each matrix having at least one row and n columns of cells, n−1 of which are data columns and one of which is a spare column, each cell including an input configured to receive a pulse from a pulse generator for triggering a shift of data out of a respective cell;

each cell in a column of cells operable to simultaneously shift data from a respective cell in one column in each matrix to a cell of a next adjacent column, whereby data input to a first column of the n−1 data columns of each matrix is received from the spare column of a matrix adjacent to that first column, and data from a last column of the n−1 data columns of each matrix is passed to the spare column of the same matrix.

4. The shift register matrix of claim 3 where the shift register matrix receives as an input data which is coupled to a first column of the n−1 data columns of a first matrix, and data from a last column of the n−1 data columns of a last matrix in the shift register matrix is provided as an output from the shift register matrix.

* * * * *